(12) United States Patent
Meng et al.

(10) Patent No.: US 9,318,508 B2
(45) Date of Patent: Apr. 19, 2016

(54) ARRAY SUBSTRATE AND METHOD FOR PRODUCING THE SAME, DISPLAY

(71) Applicants: Hefei BOE Optoelectronics Technology Co., LTD., Anhui (CN); BOE Technology Group Co., LTD., Beijing (CN)

(72) Inventors: Qingchao Meng, Beijing (CN); Kiyoung Kwon, Beijing (CN); Chengda Zhu, Beijing (CN); Baoquan Zhou, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 148 days.

(21) Appl. No.: 14/203,948

(22) Filed: Mar. 11, 2014

(65) Prior Publication Data

US 2015/0000969 A1     Jan. 1, 2015

(30) Foreign Application Priority Data

Jun. 26, 2013   (CN) ...................... 2013 2 0372625 U

(51) Int. Cl.
*H05K 1/02* (2006.01)
*H01L 27/12* (2006.01)
*G02F 1/1368* (2006.01)

(52) U.S. Cl.
CPC ............ *H01L 27/124* (2013.01); *G02F 1/1368* (2013.01)

(58) Field of Classification Search
CPC ... H01L 21/28017; H01L 21/60; H01L 21/90; H01L 21/77; H01L 21/283; H01L 21/768; H01L 23/522; H01L 23/5226; H01L 23/485; H01L 27/12; H01L 27/124; H01L 27/127; H01L 27/1288; H01L 29/78672; H01L 29/66742; H01L 29/66765; H01L 29/786; H01L 33/16; H01L 21/32051; H01L 21/76802; H01L 21/76877; H01L 21/76838; H01L 23/53223; H01L 27/10885; H01L 27/1088; H01L 27/10811; H01L 27/14643; H01L 27/14609; H01L 2924/002; H01L 33/08; H05K 3/107; H05K 3/10; H05K 1/02; H05K 1/0254; G02F 1/1368; G02F 1/133516; G02F 1/136227; G02F 1/1362; G02F 1/1335; G02F 1/1343; G02F 1/1337; G02F 1/13439; G09G 3/3233; G09G 3/32

USPC ............ 174/262; 438/30, 158, 104, 625, 151, 438/653; 257/59, 88, E33.053, E21.535, 257/E21.584, E27.132, 223, E27.133, 257/E33.53; 345/80; 349/46, 141, 106, 129, 349/130, 144, 139, 59; 437/43, 50, 59, 101, 437/203, 194, 195, 228, 19, 174; 216/18; 250/208.1, 214 R; 348/E03.018

See application file for complete search history.

(56) References Cited

U.S. PATENT DOCUMENTS 6,252,215 B1 *  6/2001  Mei .................... H01L 27/14609
                                                      250/208.1
6,407,782 B1 *  6/2002  Kim .................. G02F 1/136227
                                                      349/106

(Continued)

*Primary Examiner* — Timothy Thompson
*Assistant Examiner* — Guillermo Egoavil
(74) *Attorney, Agent, or Firm* — Westman, Champlin & Koehler, P.A.

(57) ABSTRACT

An array substrate, comprising: a substrate; a metal pattern formed on the substrate; an insulation layer formed on the metal pattern and formed with a via therein; and a transparent conductive pattern formed on the insulation layer and electrically connected to the metal pattern through the via, wherein the via has a cross section exhibiting an irregular geometry shape having a curved side edge.

19 Claims, 2 Drawing Sheets

(56) References Cited

U.S. PATENT DOCUMENTS

2005/0082528 A1* 4/2005 Kobayashi ......... G02F 1/13458 257/57

2011/0212618 A1* 9/2011 Ireland .............. H01L 21/32051 438/653

* cited by examiner

ARRAY SUBSTRATE AND METHOD FOR PRODUCING THE SAME, DISPLAY

CROSS-REFERENCE TO RELATED APPLICATION

This application claims the benefit of Chinese Patent Application No. 201320372625.1 filed on Jun. 26, 2013 in the State Intellectual Property Office of China, the whole disclosure of which is incorporated herein by reference.

BACKGROUND OF THE INVENTION

1. Field of the Invention

The present invention relates to a technical field of display, more particularly, relates to an array substrate, a method for producing the array substrate, and a display comprising the array substrate.

2. Description of the Related Art

So far, Thin Film Transistor Liquid Crystal Display (TFT-LCD) holds a dominant position in a panel display market because the TFT-LCD has many advantages, such as, small volume, low power consumption, less radiation, etc.

FIG. 1 is an illustrative plan view of a wiring region of a peripheral circuit area of an array substrate in the prior art. As shown in FIG. 1, the array substrate comprises a substrate 1, a gate electrode 2, a source/drain electrode 3 and a transparent conductive pattern 4. The gate electrode 2 and the source/drain electrode 3 are formed on the substrate 1. A first via 10 is formed in an insulation layer above the gate electrode 2, and a second via 11 is formed in the insulation layer above the source/drain electrode 3. The transparent conductive pattern 4 is electrically connected to the gate electrode 2 through the first via 10. Also, the transparent conductive pattern 4 is electrically connected to the source/drain electrode 3 through the second via 11. As a result, the gate electrode 2 is electrically connected to the source/drain electrode 3 through the transparent conductive pattern 4. The first via 10 has a cross section exhibiting a round shape or a circle ring shape. Also, the second via 11 has a cross section exhibiting a round shape or a circle ring shape.

In the prior arts, as shown in FIG. 1, since the cross section of the via is designed to exhibit a round shape or a circle ring shape, a laying area of the transparent conductive pattern in the via becomes very small, reducing the occurrence of the electro-static discharge, and decreasing the anti-breakdown ability of the array substrate.

SUMMARY OF THE INVENTION

The present invention has been made to overcome or alleviate at least one aspect of the above mentioned disadvantages.

Accordingly, it is an object of the present invention to provide an array substrate, a method for producing the array substrate and a display comprising the array substrate, in which a laying area of a transparent conductive pattern in a via is increased, and the anti breakdown ability of the array substrate is improved.

According to an aspect of the present invention, there is provided an array substrate, comprising:

a substrate;

a metal pattern formed on the substrate;

an insulation layer formed on the metal pattern and formed with a via therein; and a transparent conductive pattern formed on the insulation layer and electrically connected to the metal pattern through the via, wherein the via has a cross section exhibiting an irregular geometry shape having a curved side edge.

According to another aspect of the present invention, there is provided a method for producing an array substrate, comprising steps of:

providing a substrate;

forming a metal pattern on the substrate;

forming an insulation layer on the metal pattern, and forming a via in the insulation layer; and forming a transparent conductive pattern on the insulation layer, wherein the transparent conductive pattern is electrically connected to the metal pattern through the via, and wherein the via has a cross section exhibiting an irregular geometry shape having a curved side edge.

According to another aspect of the present invention, there is provided a display comprising an array substrate, the array substrate comprising:

a substrate;

a metal pattern formed on the substrate;

an insulation layer formed on the metal pattern and formed with a via therein; and a transparent conductive pattern formed on the insulation layer and electrically connected to the metal pattern through the via, wherein the via has a cross section exhibiting an irregular geometry shape having a curved side edge.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
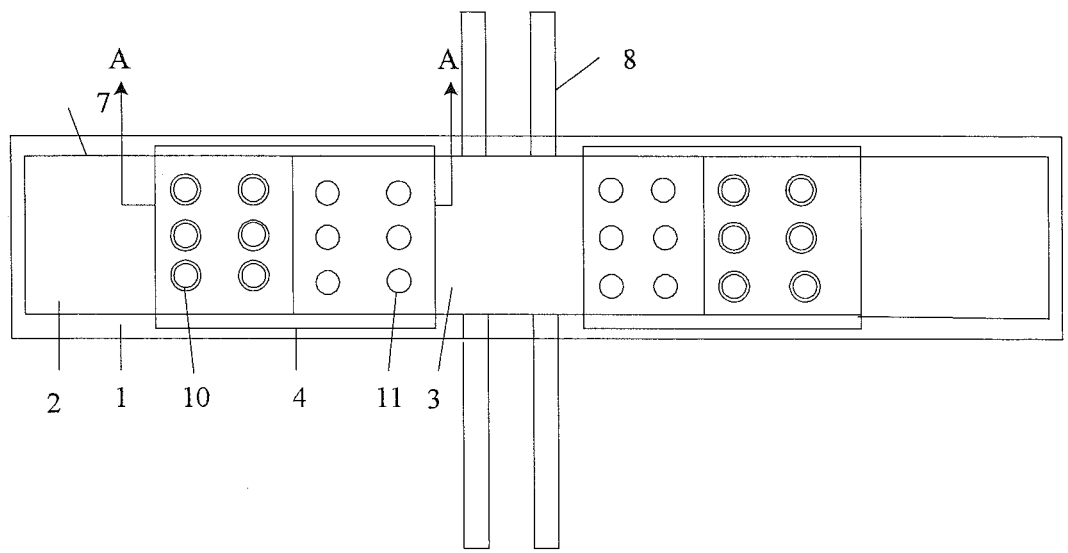
FIG. 1 is an illustrative plan view of a wiring region of a peripheral circuit area of an array substrate in prior arts.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

According to a general concept of the present invention, there is provided an array substrate, comprising: a substrate 1; a metal pattern 2, 3 formed on the substrate 1; an insulation layer 7 formed on the metal pattern 2, 3 and formed with a via 5, 6 therein; and a transparent conductive pattern 4 formed on the insulation layer 7 and electrically connected to the metal pattern 2, 3 through the via 5, 6. The via 5, 6 has a cross section exhibiting an irregular geometry shape having a curved side edge.

Figure 2:
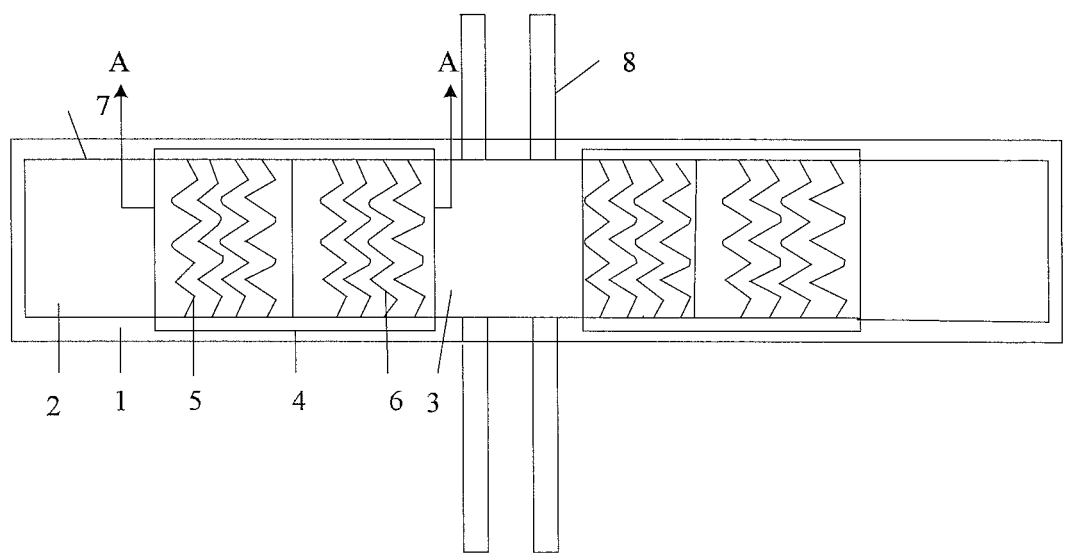
FIG. 2 is an illustrative plan view of an array substrate according to an exemplary embodiment of the present invention.
Figure 3:
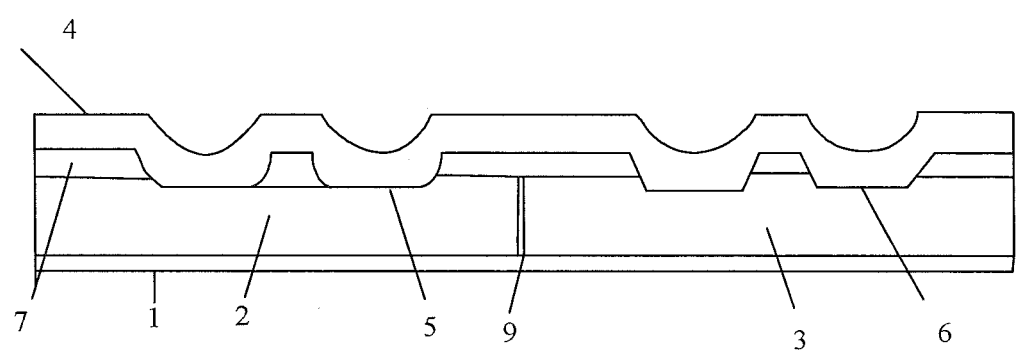
FIG. 3 is an illustrative local cross section view of a left side portion of the array substrate of FIG. 2 taken along a line A-A shown in FIG. 2.

FIG. 2 is an illustrative plan view of an array substrate according to an exemplary embodiment of the present invention; and FIG. 3 is an illustrative local cross section view of a left side portion of the array substrate of FIG. 2 taken along a line A-A shown in FIG. 2.

As shown in FIGS. 2-3, the array substrate mainly comprises a substrate 1, a first metal pattern 2, a second metal pattern 3 and a transparent conductive pattern 4. The first metal pattern 2 and the second metal pattern 3 are formed on the substrate 1. A first via 5 is formed in an insulation layer 7 (see FIG. 3) above the first metal pattern 2, and a second via 6 is formed in the insulation layer 7 (see FIG. 3) above the second metal pattern 3. The transparent conductive pattern 4 is electrically connected to the first metal pattern 2 through the first via 5, and the transparent conductive pattern 4 is electrically connected to the second metal pattern 3 through the second via 6. As a result, the first metal pattern 2 is electrically connected to the second metal pattern 3 through the transparent conductive pattern 4. The first via 5 has a cross section exhibiting an irregular geometry shape having a curved side edge, and the second via 6 has a cross section exhibiting an irregular geometry shape having a curved side edge.

In an exemplary embodiment, the first metal pattern 2 and the second metal pattern 3 may be formed by a patterning process. In a further exemplary embodiment, the first metal pattern 2 may function as a gate electrode pattern, and the second metal pattern 3 may function as a source/drain electrode pattern. The source/drain electrode pattern may be formed by a single patterning process.

In an exemplary embodiment, the process of forming the first metal pattern 2 and the second metal pattern 3 may comprise steps of: providing a substrate 1, and cleaning the substrate 1; depositing a gate metal layer on the cleaned substrate 1; coating a photoresist layer on the gate metal layer, and exposing, developing and etching the photoresist layer with a mask to form the gate electrode pattern (the first metal pattern) 2; depositing a gate insulation layer on the substrate 1 on which the first metal pattern 2 has been formed; depositing a polysilicon layer on the gate insulation layer; coating a photoresist layer on the polysilicon layer, and exposing, developing and etching the photoresist layer with a mask to form an active layer pattern; depositing a source/drain metal layer on the substrate on which the active layer pattern has been formed; coating a photoresist layer on the source/drain metal layer, and exposing, developing and etching the photoresist layer with a mask to form the source/drain electrode pattern (the second metal pattern) 3. In another exemplary embodiment, a lead 8 connected to the gate electrode pattern 2 may be formed during forming the gate electrode pattern 2. The gate metal layer may be a single metal layer or a composite metal layer. In a case where the gate metal layer is the composite metal layer, the gate metal layer may be made of AlNd/Cr/CrNx, AlNd/Mo, Mo/AlNd/Mo, Al, Al/Mo, Mo/AUMo, or a material consisting of Cu and other buffer metal, for example, Mo, Nb and Ti.

In an exemplary embodiment, the first via 5 is formed in the insulation layer 7 above the first metal pattern 2, and the second via 6 is formed in the insulation layer 7 above the second metal pattern 3. The first via 5 and the second via 6 may be made by a patterning process. In an exemplary embodiment, the process of forming the first via 5 and the second via 6 may comprise steps of depositing the insulation layer 7 on the substrate 1 on which the first metal pattern 2 has been formed, wherein the insulation layer 7 may comprise a passivation layer and a resin layer; exposing and developing the resin layer with a mask, and etching the exposed resin layer to form the first via 5; depositing the insulation layer 7 on the substrate 1 on which the second metal pattern 3 has been formed, wherein the insulation layer 7 may comprise a passivation layer and a resin layer; exposing and developing the resin layer with a mask, and etching the exposed resin layer to form the second via 6. In an exemplary embodiment, the passivation layer may be made of SiNx, SiOx, SiOxNy, or any combination thereof.

In an exemplary embodiment, the transparent conductive pattern 4 may be formed by a patterning process. In an exemplary embodiment, the process of forming the transparent conductive pattern 4 may comprise steps of: depositing a transparent conductive layer on the resin layer; exposing, developing and etching the transparent conductive layer with a mask to form the transparent conductive pattern 4. The transparent conductive layer may be made of ITO (Indium Tin Oxide) or IZO (Indium-doped Zinc Oxide). The transparent conductive pattern 4 is filled in the first via 5 and electrically connected to the first metal pattern 2. Also, the transparent conductive pattern 4 is filled in the second via 6 and electrically connected to the second metal pattern 3. In an embodiment, the first via 5 and the second via 6 each has a cross section exhibiting an irregular geometry shape having a curved side edge, increasing the laying area of the transparent conductive pattern 4 in the first via 5 and the second via 6, enhancing the anti-breakdown ability of the array substrate.

In an exemplary embodiment, the first metal pattern 2 is arranged to be adjacent to the second metal pattern 3 in a first direction (left-right direction in FIG. 2) perpendicular to a depth direction (up-down direction in FIG. 3) of the first and second vias 5, 6. Each of the first and second vias 5, 6 has a predetermined length in a second direction (up-down direction in FIG. 2) perpendicular to the depth direction and the first direction, and the predetermined length may be set to be substantially the same as a length of the first and second metal patterns 2, 3 in the second direction. In this way, the laying area of the transparent conductive pattern 4 in the first and second vias 5, 6 may be further increased, and the anti-breakdown ability of the array substrate may be further enhanced.

In an exemplary embodiment of the present invention, the curved side edge of the irregular geometry shape of the cross section of the first and second vias 5, 6 may comprise a sine curve shaped side edge, a cosine curve shaped side edge or a zigzag side edge.

In an exemplary embodiment, as shown in FIGS. 2-3, two zigzag side edges of each of the first and second vias 5, 6 have the same shapes, and are aligned with and separated from each other in first direction. In application, the insulation layer 7 is formed above the first metal pattern 2 and the second metal pattern 3, and the first via 5 and the second via 6 are formed in the insulation layer 7. In an exemplary embodiment, there are a plurality of first vias 5 and a plurality of second vias 6 in the insulation layer 7.

In an exemplary embodiment, the first via 5 and the second via 6 are formed near the lead 8. In another exemplary embodiment, a protect layer pattern 9 filled between the first metal pattern 2 and the second metal pattern 3 may be formed during forming the first metal pattern 2 and the second metal pattern 3.

According to the embodiment as shown in FIGS. 2 and 3, there is provided an array substrate mainly comprising a substrate, a first metal pattern, a second metal pattern and a transparent conductive pattern. The first metal pattern and the second metal pattern are formed on the substrate. A first via is formed in an insulation layer above the first metal pattern, and a second via is formed in the insulation layer above the second metal pattern. The transparent conductive pattern is electrically connected to the first metal pattern through the first via, and the transparent conductive pattern is electrically connected to the second metal pattern through the second via. As a result, the first metal pattern is electrically connected to the second metal pattern through the transparent conductive pattern. The first via has a cross section exhibiting an irregular geometry shape having a curved side edge, and the second via has a cross section exhibiting an irregular geometry shape having a curved side edge. In this way, the laying area of the transparent conductive pattern in the first and second vias is increased, and the anti-breakdown ability of the array substrate is enhanced.

In another aspect of the present invention, there is provided a display comprising the array substrate according to the above embodiments. The array substrate mainly comprises a substrate, a first metal pattern, a second metal pattern and a transparent conductive pattern. The first metal pattern and the second metal pattern are formed on the substrate. A first via is formed in an insulation layer above the first metal pattern, and a second via is formed in the insulation layer above the second metal pattern. The transparent conductive pattern is electrically connected to the first metal pattern through the first via, and the transparent conductive pattern is electrically connected to the second metal pattern through the second via. As a result, the first metal pattern is electrically connected to the second metal pattern through the transparent conductive pattern. The first via has a cross section exhibiting an irregular geometry shape having a curved side edge, and the second via has a cross section exhibiting an irregular geometry shape having a curved side edge.

In application, the first metal pattern, the second metal pattern, the insulation layer, the first via, the second via and the transparent conductive pattern may be successively formed on the substrate by a patterning process.

In an exemplary embodiment, the first metal pattern may function as a gate electrode pattern, and the second metal pattern may function as a source/drain electrode pattern. In an exemplary embodiment, the process of forming the array substrate may comprise steps of: providing a substrate, and cleaning the substrate; depositing a gate metal layer on the cleaned substrate; coating a photoresist layer on the gate metal layer, and exposing, developing and etching the photoresist layer with a mask to form the gate electrode pattern; depositing a gate insulation layer on the substrate on which the first metal pattern has been formed; depositing a polysilicon layer on the gate insulation layer; coating a photoresist layer on the polysilicon layer, and exposing, developing and etching the photoresist layer with a mask to form an active layer pattern; depositing a source/drain metal layer on the substrate on which the active layer pattern has been formed; coating a photoresist layer on the source/drain metal layer, and exposing, developing and etching the photoresist layer with a mask to form the source/drain electrode pattern; depositing the insulation layer on the substrate on which the first metal pattern has been formed, wherein the insulation layer may comprise a passivation layer and a resin layer; exposing and developing the resin layer with a mask, and etching the exposed resin layer to form the first via; depositing the insulation layer on the substrate on which the second metal pattern has been formed, wherein the insulation layer may comprise a passivation layer and a resin layer; exposing and developing the resin layer with a mask, and etching the exposed resin layer to form the second via; depositing a transparent conductive layer on the resin layer; exposing, developing and etching the transparent conductive layer with a mask to form the transparent conductive pattern. The transparent conductive layer may be made of ITO (Indium Tin Oxide) or IZO (Indium-doped Zinc Oxide).

In an exemplary embodiment, a protect layer pattern 9 filled between the first metal pattern 2 and the second metal pattern 3 may be formed during forming the first metal pattern 2 and the second metal pattern 3. In application, the insulation layer 7 is formed above the first metal pattern 2 and the second metal pattern 3, and the first via 5 and the second via 6 are formed in the insulation layer 7. In an exemplary embodiment, a plurality of first vias 5 and a plurality of second vias 6 are formed in the insulation layer 7. In another exemplary embodiment, the first via 5 and the second via 6 are formed near the lead 8.

In an exemplary embodiment, the gate metal layer may be a single metal layer or a composite metal layer. In a case where the gate metal layer is the composite metal layer, the gate metal layer may be made of AlNd/Cr/CrNx, AlNd/Mo, Mo/AlNd/Mo, Al, Al/Mo, Mo/Al/Mo, or a material consisting of Cu and other buffer metal, for example, Mo, Nb and Ti. In an exemplary embodiment, the passivation layer may be made of SiNx, SiOx, SiOxNy, or any combination thereof.

In another aspect of the present invention, there is provided a display comprising an array substrate. The array substrate comprises a display region and a peripheral circuit region. The peripheral circuit region comprises a wiring region. The array substrate mainly comprising: a substrate 1; a metal pattern 2, 3 formed on the substrate 1; an insulation layer 7 formed on the metal pattern 2, 3 and formed with a via 5, 6 therein; and a transparent conductive pattern 4 formed on the insulation layer 7 and electrically connected to the metal pattern 2, 3 through the via 5, 6, wherein the via 5, 6 has a cross section exhibiting an irregular geometry shape having a curved side edge.

In an embodiment, the array substrate comprises a substrate, a first metal pattern, a second metal pattern and a transparent conductive pattern. The first metal pattern and the second metal pattern are formed on the substrate. A first via is formed in an insulation layer above the first metal pattern, and a second via is formed in the insulation layer above the second metal pattern. The transparent conductive pattern is electrically connected to the first metal pattern through the first via, and the transparent conductive pattern is electrically connected to the second metal pattern through the second via. As a result, the first metal pattern is electrically connected to the second metal pattern through the transparent conductive pattern. The first via has a cross section exhibiting an irregular geometry shape having a curved side edge, and the second via has a cross section exhibiting an irregular geometry shape having a curved side edge. In this way, the laying area of the transparent conductive pattern in the first and second vias is increased, and the anti-breakdown ability of the array substrate is enhanced.

Please be noted that the patterning process mention herein may comprise some or all of coating photoresist, masking with mask, exposing, developing, etching and peeling photoresist. In addition, the patterning process may comprise other processes necessary for forming the pattern. Thereby, the patterning process is not limited to the above embodiments, for example, a drying may be performed after the developing and before the etching, and the etching may be a dry etching or a wet etching.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle, so that more kinds of array substrate can be achieved with overcoming the technical problem of the present invention.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An array substrate, comprising:
   a substrate;
   a metal pattern formed on the substrate;
   an insulation layer formed on the metal pattern and formed with a via therein; and
   a transparent conductive pattern formed on the insulation layer and electrically connected to the metal pattern through the via,
   wherein the via has a cross section exhibiting an irregular geometry shape which having a curved side edge,
   wherein the metal pattern comprises a first metal pattern and a second metal pattern; and
   wherein the via comprises a first via corresponding to the first metal pattern and a second via corresponding to the second metal pattern.

2. The array substrate according to claim 1, wherein the curved side edge comprises a sine curve shaped side edge, a cosine curve shaped side edge or a zigzag side edge.

3. The array substrate according to claim 1, wherein the first metal pattern is arranged to be adjacent to the second metal pattern in a first direction perpendicular to a depth direction of the via.

4. The array substrate according to claim 3,
   wherein each via has two zigzag side edges which side edges are of the same shape and aligned with and separated from each other in the first direction.

5. The array substrate according to claim 4,
   wherein each of the vias has a predetermined length in a second direction perpendicular to the depth direction and the first direction; and
   wherein the predetermined length is set to be substantially the same as a length of the metal pattern in the second direction.

6. The array substrate according to claim 1, wherein there are a plurality of first vias and a plurality of second vias in the insulation layer.

7. The array substrate according to claim 1, wherein the first metal pattern functions as a gate electrode pattern, and the second metal pattern functions as a source/drain electrode pattern.

8. The array substrate according to claim 7, further comprising: a lead connected to the gate electrode pattern, wherein the first via and the second via are located near the lead.

9. The array substrate according to claim 7, further comprising:
   a protect layer pattern filled between the first metal pattern and the second metal pattern.

10. A method for producing the array substrate according to claim 1, comprising steps of:
    providing a substrate;
    forming a metal pattern on the substrate;
    forming an insulation layer on the metal pattern, and forming a via in the insulation layer; and
    forming a transparent conductive pattern on the insulation layer,
    wherein the transparent conductive pattern is electrically connected to the metal pattern through the via, and
    wherein the via has a cross section exhibiting an irregular geometry shape which having a curved side edge.

11. The method according to claim 10,
    wherein the curved side edge comprises a sine curve shaped side edge, a cosine curve shaped side edge or a zigzag side edge.

12. The method according to claim 11, wherein the step of forming a metal pattern on the substrate comprising:
    forming a first metal pattern on the substrate;
    forming an active layer pattern on the first metal pattern; and
    forming a second metal pattern on the active layer pattern.

13. The method according to claim 12, wherein the step of forming a via in the insulation layer comprising:
    forming a first via corresponding to the first metal pattern and a second via corresponding to the second metal pattern in the insulation layer.

14. The method according to claim 12, wherein the step of forming a transparent conductive pattern on the insulation layer comprising:
    depositing a transparent conductive layer on the insulation layer, and forming the transparent conductive pattern by a single patterning process.

15. The method according to claim 14,
    wherein the first metal pattern functions as a gate electrode pattern, and the second metal pattern functions as a source/drain electrode pattern.

16. The method according to claim 15,
    forming a lead connected to the gate electrode pattern while forming the gate electrode pattern; and
    wherein the first via and the second via are located near the lead.

17. The method according to claim 16,
    forming a protect layer pattern filled between the first metal pattern and the second metal pattern during forming the first metal pattern and the second metal pattern.

18. A display comprising the array substrate according to claim 1.

19. The display according to claim 18,
    wherein the curved side edge comprises a sine curve shaped side edge, a cosine curve shaped side edge or a zigzag side edge.

* * * * *